United States Patent
Keukelaar et al.

[11] Patent Number: 5,973,405
[45] Date of Patent: Oct. 26, 1999

[54] COMPOSITE ELECTRICAL CONTACT STRUCTURE AND METHOD FOR MANUFACTURING THE SAME

[75] Inventors: Ronald Keukelaar, San Carlos; Leonard Nanis, San Jose, both of Calif.

[73] Assignee: Dytak Corporation, Redwood City, Calif.

[21] Appl. No.: 08/898,179

[22] Filed: Jul. 22, 1997

[51] Int. Cl.$^6$ .................................................. H01L 23/48
[52] U.S. Cl. .......................... 257/780; 438/610; 438/613; 438/614; 438/17; 257/48; 257/746; 257/739; 257/737
[58] Field of Search ...................... 257/780, 772, 257/737, 738, 48, 746, 739; 438/612, 613, 614, 615, 610, 17

[56] References Cited

U.S. PATENT DOCUMENTS

| | | | |
|---|---|---|---|
| 4,636,722 | 1/1987 | Ardezzone | 324/158 P |
| 4,891,585 | 1/1990 | Janko et al. | 324/158 P |
| 4,906,920 | 3/1990 | Huff et al. | 324/158 P |
| 4,912,399 | 3/1990 | Greub et al. | 324/158 P |
| 4,918,383 | 4/1990 | Huff et al. | 324/158 F |
| 4,922,192 | 5/1990 | Gross et al. | 324/158 P |
| 4,980,637 | 12/1990 | Huff et al. | 324/158 P |
| 5,012,187 | 4/1991 | Littlebury | 324/158 F |
| 5,180,977 | 1/1993 | Huff | 324/158 P |
| 5,225,037 | 7/1993 | Elder et al. | 156/644 |
| 5,346,775 | 9/1994 | Jin et al. | |
| 5,412,866 | 5/1995 | Woith et al. | 29/848 |
| 5,487,999 | 1/1996 | Farnworth | 437/7 |
| 5,600,256 | 2/1997 | Woith et al. | 324/754 |
| 5,604,446 | 2/1997 | Sano | 324/758 |
| 5,623,213 | 4/1997 | Liu et al. | 324/754 |
| 5,625,298 | 4/1997 | Hirano et al. | 324/754 |
| 5,629,630 | 5/1997 | Thompson et al. | 324/754 |
| 5,796,164 | 8/1998 | McGraw et al. . | |

FOREIGN PATENT DOCUMENTS 62-197292  8/1987  Japan .

OTHER PUBLICATIONS

Goldschmidt, H.J., "Interstitial Alloys", Butterworth & Co., Ltd. (Publishers), London, England (1967), Library of Congress No. 67–31095, pp. 1–59.

*Primary Examiner*—Caridad Everhart
*Attorney, Agent, or Firm*—Wilson, Sonsini Goodrich & Rosati

[57] ABSTRACT

An improved wear resistant bump contact is produced by the inclusion of small particles of hard materials in the conductive material of the contact bump, preferably by co-deposition at the time of electroplating of the bump bulk material. Desirable attributes of the small particles of hard material include small particle size, hardness greater than the hardness of the bulk material of the contact bump, compatibility with the plating conditions, and electrical conductivity. Nitride, borides, suicides, carbides are typical interstitial compounds suitable for use in satisfying these desirable attributes. In one preferred example, a nickel bulk material and silicon carbide particles are utilized. In one variation, the bump of metal-particle co-deposited material is coated by a thin cap layer of noble, non-oxidizing metal to prevent electrical erosion by arcing as contact is made and broken from the pad. Rhodium and ruthenium are suitable metals and can be electrodeposited over the composite bump structure.

54 Claims, 2 Drawing Sheets

ELECTROPLATING SOLUTION AND CO-DEPOSITION PARTICLES

COMPOSITE ELECTRICAL CONTACT STRUCTURE AND METHOD FOR MANUFACTURING THE SAME

BACKGROUND OF THE INVENTION

1. Field of the Invention

The present invention relates to the manufacturing and testing of integrated circuits. More particularly, the present invention relates to electrical contacts on probe elements such as on membrane probe cards used in integrated circuit testing.

2. Description of Related Art

Integrated circuit chips are formed using fabrication processes which build many chips on wafers, which are for example 6 or 8 inches in diameter or larger. While the chips are still on the wafer in as-formed positions, a membrane probe can be used to electrically sense the performance of the circuits on the chips. See for example U.S. Pat. No. 5,180,977 entitled MEMBRANE PROBE CONTACT BUMP COMPLIANCY SYSTEM invented by Huff; U.S. Pat. No. 4,980,673 entitled FORCE DELIVERY SYSTEM FOR IMPROVED PRECISION MEMBRANE PROBE invented by Huff et al.; U.S. Pat. No. 4,918,383 entitled MEMBRANE PROBE WITH AUTOMATIC CONTACT SCRUB ACTION invented by Huff et al; and U.S. Pat. No. 4,906,920 entitled SELF-LEVELING MEMBRANE PROBE invented by Huff et al. In accordance with this technology, costs savings are possible through early identification of faulty circuits before they are separated from the wafer, and thereafter assembled into chip packages.

Good electrical contact between the probe contacts and chip contacts, often called pads, is essential for accurate evaluation. The contacts of chips on the wafer are formed typically of aluminum or combinations of aluminum with other metals, and have a natural skin of hard aluminum oxide, or other natural hard skin caused by oxidation or other reactions with the environment. Wear of the probe contacts occurs as a result of repeated contact with the hard aluminum oxide skin, resulting in a degradation of the accuracy of the measurements over time.

In the prior art, the probe elements are formed with a contact bump technology usually based on nickel sulfamate plating to build up bump contacts. However the nickel deposit as a result of this plating technique is too soft for extended use, for example beyond about fifty thousand to one hundred thousand touchdowns. With such extended use, the contour of the nickel bump frequently develops an undesirable flattened area.

One prior art technique for improving the performance of the contact bumps involves creating a rough textured surface on the bump. See U.S. Pat. No. 5,487,999 entitled METHOD FOR FABRICATING A PENETRATION LIMITED CONTACT HAVING A ROUGH TEXTURED SURFACE invented by Farnworth. However, the roughening of the surface as described in the Farnworth patent does not overcome the problems of the softness of the nickel bump, while it may improve the ability to penetrate the hard skin on the contact pad.

Also, examination of the tips of worn nickel bump contacts at high magnification (scanning electron microscope) indicates that the soft nickel contact surface tends to accumulate aluminum oxide. The embedded aluminum oxide ultimately degrades performance by increasing the bump to pad contact resistance. Increased friction and mechanical resistance to sliding are also associated with contact wear and aluminum oxide pickup.

Accordingly, there is a need for a technique for extending the lifetime of the contact bumps used in membrane probe cards and in other testing situations where the contacts are required to make many thousands of contacts over their useful life.

SUMMARY OF THE INVENTION

The present invention provides an improved wear resistant bump contact produced by the inclusion of small particles of hard materials in the conductive material of the contact bump, preferably by co-deposition at the time of electroplating of the bump bulk material. Desirable attributes of the small particles of hard material include small particle size, hardness greater than the hardness of the bulk material of the contact bump, compatibility with the plating conditions, and electrical conductivity. Nitrides, borides, suicides, and carbides are typical hard interstitial compounds suitable for use with metals like nickel, and which satisfy these desirable attributes.

The present invention can be characterized as a contact probe comprising a probe substrate having a set of conductive traces on the substrate. An array of contact bumps is formed on the substrate by which electrical contact is made to the set of conductive traces. The contact bumps have a raised portion extending away from the substrate and a contact surface on the raised portion. The contact bumps comprise conductive material and include particles in the conductive material at or near the contact surface. The particles comprise material harder than the conductive material to improve resistance to abrasion and to provide improved contact during the probing operation. The conductive material according to a preferred aspect of the invention comprises a metal and the particles comprise a hard conductive compound. In another aspect of the invention, a thin layer of noble, non-oxidizing metal is formed on the contact surface to improve resistance to spark erosion and other contact characteristics.

In one preferred example, nickel bulk material and silicon carbide particles are utilized. Silicon carbide is commercially available in sizes suitable for co-deposition and produces a wear resistant composite electrodeposit when used in combination with nickel and other metals. To achieve the composite electrodeposition of silicon carbide in a nickel matrix, silicon carbide of a particle size significantly smaller in the dimension of the bump is mixed with the plating solution. The carbide particles become imbedded throughout the nickel matrix as the nickel grows by electrodeposition. The co-deposited particles lodged at or near the plated surface provide the surface with hard edges to cut through the aluminum oxide skin of the contact pads on the silicon wafer. The nickel bumps thus have better opportunity to make electrical contact with aluminum metal in a scraped and cleared path on the pad. The silicon carbide is also electrically conductive, and therefore does not interfere with electrical measurements made through the contact bumps.

In addition to silicon carbide, other binary or tertiary hard interstitial compound materials of small particle size suitable for inclusion alone or as admixtures by co-deposition in nickel and other metals useful for contact bumps include titanium nitride, zirconium nitride, boron carbide, tungsten carbide, chromium carbide, and other nitrides, carbides, silicides and borides. Other hard materials such as diamond particles may also be co-deposited either alone or as an admixture to provide wear resistance to the contacts.

In one variation, the entire bump volume is comprised of metal/particle composite deposit. In another variation, substantially most of the bump may be formed by plating metal only with a subsequent cap of the metal/particle co-deposit being thereafter deposited to form a cap on the metal. In yet another alternative approach, the metal/particle co-deposition is conducted during a first part of the process under conditions which cause incorporation of a low number of particles, and during a second part of the process under conditions which cause a higher concentration of particles to be co-deposited at or near the surface of the bump.

In yet another variation of the invention, the bump of metal/particle co-deposited material is further coated by a thin cap layer of noble, non-oxidizing metal to prevent electrical erosion by arcing as contact is made and broken from the pad. Rhodium and ruthenium are suitable metals and can be electrodeposited over the composite bump structure.

Accordingly, a new composite structure, contact bump is provided according to present invention suitable for use with membrane probe cards. Testing the preferred embodiment suggests that wear resistance and resistance to abrasion are greatly improved over prior art systems.

Other aspects and advantages of the present invention can be seen upon review of the figures, the detailed description and the claims which follow.

DETAILED DESCRIPTION

Figure 1:
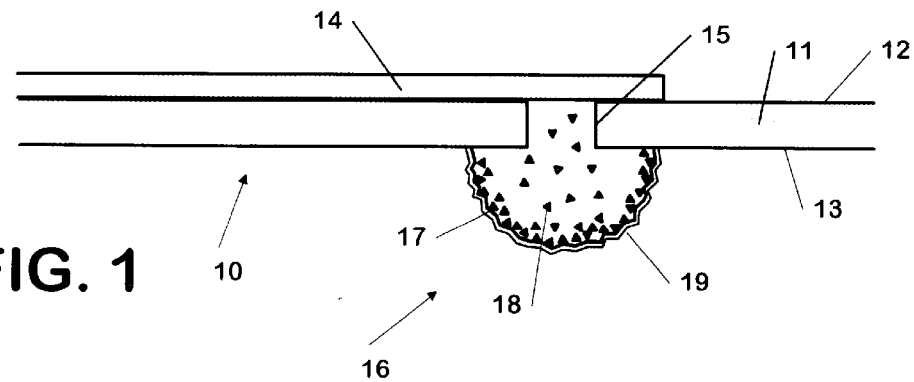
FIG. 1 is a simplified diagram of a membrane probe card with a contact bump according to the present invention.
Figure 2A:
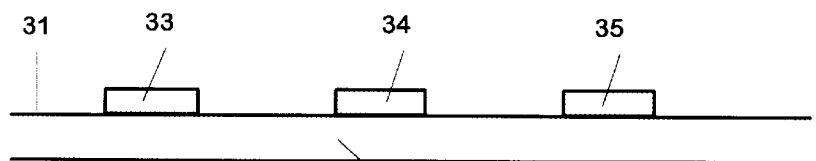
FIGS. 2A and 2B illustrate initial steps in the formation of membrane probe cards according to the present invention.
Figure 2B:
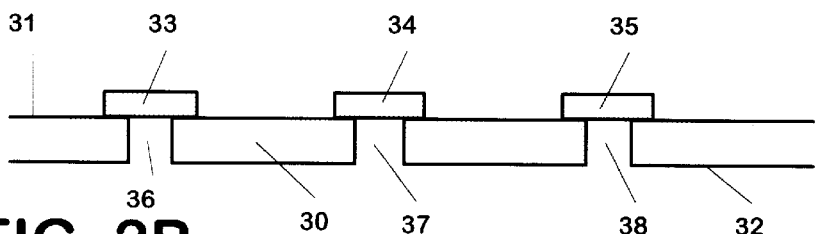
Figure 3:
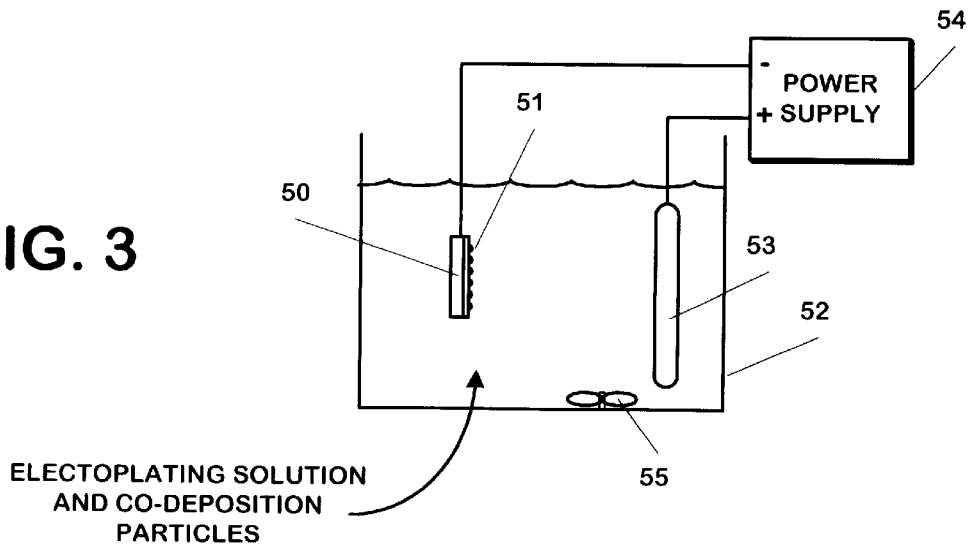
FIG. 3 is a simplified diagram of an electrodeposition bath utilized according to the process of the present invention.

A detailed description of the present invention is provided with reference to the figures, in which FIG. 1 illustrates the composite contact bump according to the present invention, and FIGS. 2 through 4 illustrate the process of manufacturing the contact bumps.

FIG. 1 illustrates a portion of a membrane probe card which an array of contact bumps is formed according to the present invention. The probe card includes a substrate 10 which is formed of a membrane 11, which is typically polyimide or another flexible, strong, insulating material. The membrane 11 has a first side 12 and a second side 13. On the first side 12, an array of conductive traces represented by trace 14, is formed. The conductive traces provide a connection path to test the circuitry coupled with the membrane probe card. Also on the membrane 11, a plurality of vias 15 is arranged in an array which matches the array of contacts on the integrated circuit chip to be tested. Contact bumps 16 are formed at the vias 15 by which electrical contact is made to the array of conductive traces 14. The contact bumps 16 extend away from the second side 13 of the membrane 11, and have a contact surface 17. Thus a wear resistant electrical contact shaped like a mushroom is grown using an electroplating method that incorporates hard particles, e.g. particle 18, in a metal matrix. A thin layer 19 of a noble, non-oxidizing metal such as rhodium is formed on the contact surface 17. According to one preferred embodiment, the contact bump includes an initial portion where the metal has a relatively low concentration of particles, and a portion at or near the surface with an increased particle density.

In one preferred embodiment, the metal comprises nickel and the particles comprise silicon carbide. However, a wide variety of elecroplateable metals may be substituted, as well as a wide variety hard particles, as mentioned above.

Interstitial compounds are well suited for use as the co-deposited particles. (See Goldschmidt, INTERSTITIAL ALLOYS, Plenum Press (1967) (Library of Congress No. 67-31095) for a description of interstitial compounds in general). For example, suitable particles comprise a carbide
   of periodic table Group IV metals Ti, Zr, Hf
   or of Group V metals V, Nb, Ta
   or of Group VI metals Cr, Mo, W
   or of two or more transition metals
   or of the non-metallic elements B, Si.
Other suitable particles comprise a nitride
   of periodic table Group IV metals Ti, Zr, Hf
   or of Group V metals V, Nb, Ta
   or of Group VI metals Cr, W
   or of two or more transition metals
   or of the non-metallic elements B, Si
   or as a metal carbonitride.
Other suitable particles comprise a boride
   of periodic table Group IV metals Ti, Zr, Hf
   or of Group V metals V, Nb, Ta
   or of Group VI metals Cr, Mo, W
   or of two or more transition metals
   or of the non-metallic elements C, N
   or as a metal borocarbide or metal boronitride.
Yet other suitable particles comprise a silicide
   of periodic table Group IV metals Ti, Zr, Hf
   or of Group V metals v, Nb, Ta
   or of Group VI metals Cr, Mo, W
   or of two or more transition metals
   or of the non-metallic elements C, N
   or as a metal nitride-silicide or metal borosilicide or metal carbosilicide.

In the preferred embodiment, the contact bumps 16 are used in the fabrication of contacts on a membrane probe card used for testing integrated circuits. These integrated circuits have aluminum contact pads that upon exposure to the atmosphere form an electrically insulating, hard, abrasive oxide skin on the surface. The oxide is typically 50 to 200 Angstroms in thickness. The contact bumps readily penetrate the oxide to make contact with the underlying aluminum metal, and resist wear from the abrasive aluminum oxide. Future trends in integrated circuit manufacturing provide for contact pads of other materials, such as tin/lead mixtures, and other metallurgies. These metallurgies also typically will include a hard oxide layer or other skin layer that the contact bump according to the present invention will similarly cut through to make contact with the underlying metal.

The fabrication process for a membrane probe card is begun as illustrated in FIGS. 2A and 2B. The process begins with a membrane 30 having a first side 31 and a second side 32. An array of copper traces 33, 34, 35 is formed on the first side of the membrane 30 using photolithography or other well known techniques. The membrane 30 typically consists of a 0.0003 to 0.001 inch (0.3 to 1 mil) thick polyimide film with copper traces on one side.

As shown in FIG. 2B, contact vias 36, 37, 38 are formed in the membrane 30. The vias are formed in one preferred embodiment using an eximer laser to drill a hole through the polyimide to the copper traces 33, 34, 35 on the first side of the membrane. These small holes, typically 10 to 80 microns (about 0.4 to 3 mils) in diameter, are chemically cleaned and the film is placed in an insulating fixture made for example of Teflon.

As shown in FIG. 3, a resulting structure comprising a fixture 50 and a membrane probe card element 51 can then be suspended in an electroplating solution. The fixture allows only the copper at the bottom of each via to be exposed to the electroplating solution.

The structure is placed in a electroplating bath 52. The electroplating bath 52 includes electrode 53 which is coupled to a power supply 54. Also, the conductive traces on the probe card element 51 are coupled to the power supply 54 to provide a current path. The electroplating bath 52 includes a stirrer 55 which is controlled to maintain the mixture in the bath. For the embodiment involving nickel and silicon carbide, the electroplating solution includes commercially available nickel sulfamate electroplating solution (for example Sel-Rex (tm) from Enthone-OMI, Inc. New Haven, Conn.). To the electroplating solution is added silicon carbide particles in an amount from 30 to 50 grams per liter from Fujimi Corporation of Elmhurst, Ill. Silicon carbide particles having an average particle diameter of 1.0 micron or less are used in one preferred system.

The current density is controlled by the power supply 54 during each step in the contact growth. The first portion of the contact is grown at a low current density of for example ten to twenty five amps per square foot (ASF) producing a very uniform height for all contacts. However, at this low ASF, the density of silicon carbide particles in nickel is relatively low. To increase the desired particle density, the ASF is increased to a greater value, for example forty to fifty ASF for a short time, thereby adding a thin surface layer of material with a higher particle density. The contact height is controlled precisely by the total electroplating time and current densities. Rhodium is then plated on the surface, resulting in the entire contact surface being covered with rhodium. Rhodium thickness is controlled by the power supply, and is electroplated at 2.0 to 30.0 ASF to a thickness of about 0.25 to 4.0 microns.

In one preferred example, all contacts on a film are grown to a height of twenty microns at fifteen ASF producing a very uniform height but a low particle density. Two additional microns are added at forty five ASF producing a desirable greater particle density yet maintaining the needed contact height uniformity. At a height of twenty two microns, the membrane film is now removed from the nickel electroplating solution, but remains in the electroplating fixture. The structure is rinsed thoroughly with deionized water and the bumps are not allowed to dry to prevent oxide growth. The fixture and membrane film are now submerged in a commercially available rhodium electroplating solution (Rodex SP from Enthone-OMI sel-rex). An added selenium stress reducer (Rodex 100 from Enthone-OMI sel-rex) can be added. A thin 1.0 micron rhodium layer is electroplated at twelve ASF over the nickel and silicon carbide particles, completing the contact.

Figure 4A:
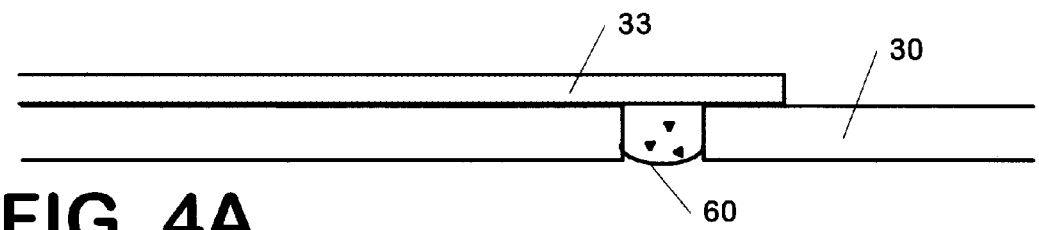
FIGS. 4A through 4E illustrate stages of contact growth according to the present invention.
Figure 4B:
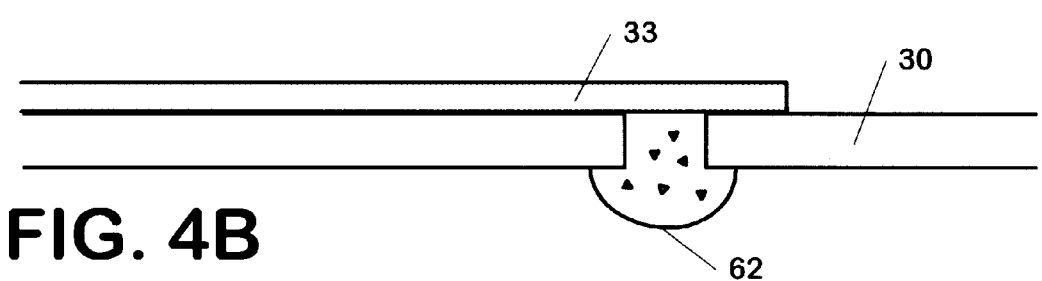
Figure 4C:
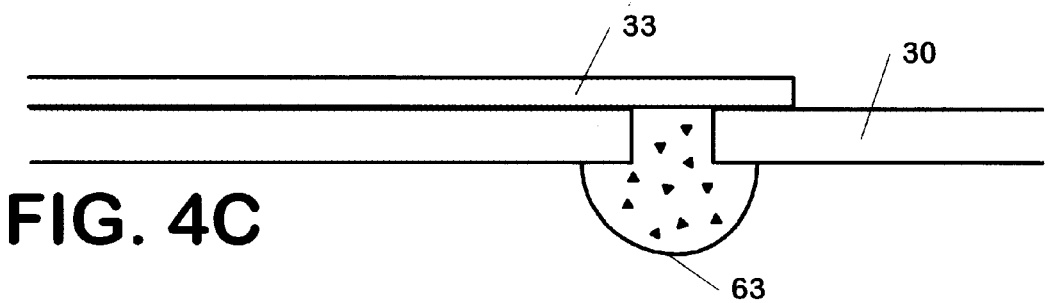

FIGS. 4A through 4E illustrate the stages of contact growth. During initial phases of the contact growth as shown in FIG. 4A, relatively low particle density metal is deposited at a uniform rate as illustrated by the material 60. As the process continues as illustrated in FIG. 4B, the contact begins to overlap the sides of the polyimide membrane 30 and take on a mushroom shape. The bump 62 continues to have a relatively low particle density because of the low ASF employed during these stages. At the end of the first stage of the contact growth, the mushroom shape and the majority of the bulk of the bump 63 is formed with a relatively low particle density.

Figure 4D:
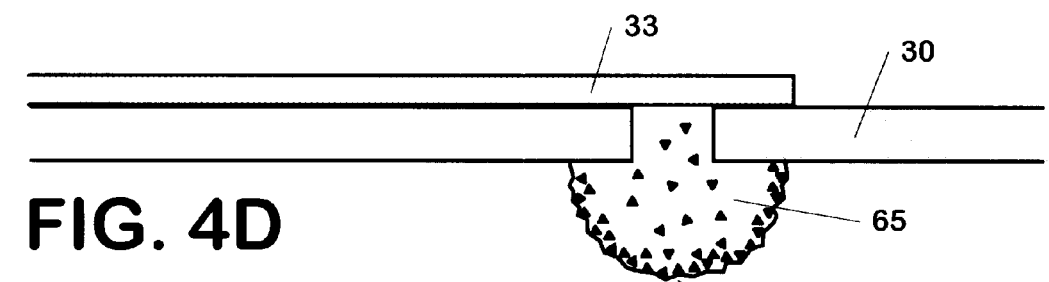
Figure 4E:
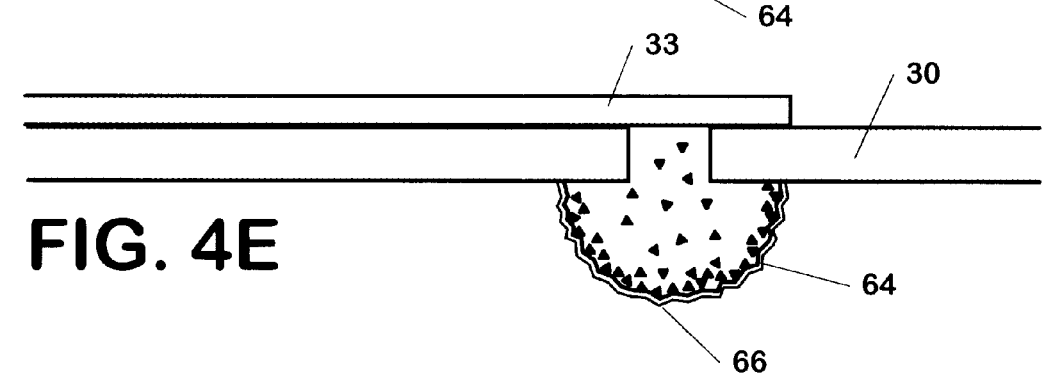

As illustrated in FIG. 4D, increased particle density is achieved by increasing the ASF during the final stages of the electrodeposition. Thus, an increased particle density is achieved at or near the surface 64 of the bump 65. Finally, as shown in FIG. 4E, a rhodium coating 66 is formed over the contact surface 64 of the bump.

The surface of the finished electrical contract has a "macro" roughness resulting from silicon carbide particles, but has a "micro" smooth surface due to the electrodeposited rhodium layer. The protruding, relatively conductive silicon carbide particle tips make good electrical contact resulting in a long lasting, abrasive resistant, electrical contact. Silicon carbide particles cut through the oxide layer contacting the metal, yet neither dislodge nor wear against the aluminum oxide. The oxide-resistant rhodium metal resists the adhesion of aluminum and aluminum oxide on the surface preventing build up that occurs within an exposed nickel surface. Rhodium also resists erosion caused by electrical arc formation.

The particle size and particle density utilized in a given contact structure will vary somewhat with each type of integrated circuit, depending on such differences at the chip pad shape, the configuration of the pads, the composition of the pads, the total number of the pads, and the current conducted by the pads. Accordingly, the manufacturing techniques used for implementing the bumps can vary depending on the particular implementation required. It is preferable that the particles have a size substantially smaller than the size of the bump, such as less than $\frac{1}{10}$ the diameter of the bump and more preferably less than $\frac{1}{20}$ the diameter of the bump. One micron average size particles are found suitable for bumps having diameters in the ranges 0.5 to 1.0 mil (about 13 to 25 microns). Of course larger size particles and smaller size particles could be suitable in a variety of settings.

The composition of the particles is preferably a hard, conductive interstitial compound or another hard conductive material. Other hard materials, which are less conductive, such as diamond, can be used as long as the particle size is small enough that it does not interfere with establishing excellent contact to the metal matrix supporting the particles, or alternatively the particles are manufactured in a way to increase their electrical conductivity.

The hardness of the particles is best understood by considering that they must be hard enough to penetrate the aluminum oxide skin on the contact pads, without significant wear. However, it is sufficient that the material be harder than the metal matrix supporting the particles in order to provide an improved performance.

In certain embodiments it may be desirable to improve the ability of the contact bumps to rub across the aluminum contacts. In such embodiments, additional lubricity can be provided by co-deposition of fine tetrafluoroethylene (Teflon) particles in the matrix, using the techniques such as those described above, to provide a concentration of tetrafluoroethylene particles sufficient to provide lubrication without interfering with the desirable characteristics of hardness and electrical conductivity provided by the co-deposited particles.

Accordingly, the present invention provides a method for improving the technology of forming contacts on polyimide membranes, particularly the formation of wear resistant, bump contacts having extended the useful life. Testing of the nickel/silicon carbide/rhodium bump demonstrates that superior wear resistance and excellent contact properties are provided by the contact bump of the present invention.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A contact probe comprising:
    a probe substrate;
    a set of conductive traces on the substrate;
    an array of contact bumps on the substrate, by which electrical contact is made to the set of conductive traces, the contact bumps having a raised portion extending away from the substrate and a contact surface on the raised portion, the contact bumps comprising conductive material, and particles at or near the contact surface, the particles comprising a material harder than the conductive material.

2. The contact probe of claim 1, wherein the conductive material comprises a metal.

3. The contact probe of claim 1, wherein the conductive material comprises nickel.

4. The contact probe of claim 1, wherein the particles comprise an interstitial compound.

5. The contact probe of claim 1, wherein the particles comprise a carbide
    of periodic table Group IV metals Ti, Zr, Hf
    or of Group V metals V, Nb, Ta
    or of Group VI metals Cr, Mo, W
    or of two or more transition metals
    or of the non-metallic elements B, Si.

6. The contact probe of claim 1, wherein the particles comprise a nitride
    of periodic table Group IV metals Ti, Zr, Hf
    or of Group V metals V, Nb, Ta
    or of Group VI metals Cr, W
    or of two or more transition metals
    or of the non-metallic elements B, Si
    or as a metal carbonitride.

7. The contact probe of claim 1, wherein the particles comprise a boride
    of periodic table Group IV metals Ti, Zr, Hf
    or of Group V metals V, Nb, Ta
    or of Group VI metals Cr, Mo, W
    or of two or more transitions metals
    or of the non-metallic elements C, N
    or as a metal borocarbide or metal boronitride.

8. The contact probe of claim 1, wherein the particles comprise a silicide
    of periodic table Group IV metals Ti, Zr, Hf
    or of Group V metals V, Nb, Ta
    or of Group VI metals Cr, Mo, W
    or of two or more transition metals
    or of the non-metallic elements C, N
    or as a metal nitride-silicide or metal borosilicide or metal carbosilicide.

9. The contact probe of claim 1, wherein the particles comprise silicon carbide.

10. The contact probe of claim 1, wherein the particles comprise one or more of titanium nitride, zirconium nitride, boron carbide, tungsten carbide, chromium carbide and diamond.

11. The contact probe of claim 1, wherein the particles comprise conductive material.

12. A contact probe comprising:
    a probe substrate;
    a set of conductive traces on the substrate;
    an array of contact bumps on the substrate, by which electrical contact is made to the set of conductive traces, the contact bumps having a raised portion extending away from the substrate and a contact surface on the raised portion, the contact bumps comprising conductive material, and particles at or near the contact surface, the particles comprising a material harder than the conductive material, wherein the contact bump includes a layer of non-oxidizing metal on the contact surface.

13. The contact probe of claim 12, wherein the layer of non-oxidizing metal on the contact surface comprises a noble metal.

14. The contact probe of claim 12, wherein the layer of non-oxidizing metal on the contact surface comprises rhodium.

15. The contact probe of claim 12, wherein the layer of non-oxidizing metal on the contact surface comprises ruthenium.

16. A contact probe comprising:
    a probe substrate;
    a set of conductive traces on the substrate;
    an array of contact bumps on the substrate, by which electrical contact is made to the set of conductive traces, the contact bumps having a raised portion extending away from the substrate and a contact surface on the raised portion, the contact bumps comprising conductive material, and particles at or near the contact surface, the particles comprising a material harder than the conductive material, wherein the substrate comprises a flexible material.

17. The contact probe of claim 16, wherein the flexible material comprises polyimide.

18. The contact probe of claim 1, wherein the contact bumps have a diameter and the particles have an average particle diameter less than $1/10$ the diameter of the contact bumps.

19. The contact probe of claim 1, wherein the contact bumps have a diameter and the particles have an average particle diameter less than $1/20$ the diameter of the contact bumps.

20. A contact probe comprising:
    a membrane having a first side and a second side;
    a set of conductive traces on the first side of the membrane;
    an array of vias in the membrane, the vias extending from the first side to the second side and exposing contact points on respective conductive traces in the set;
    an array of contact bumps in the array of vias by which electrical contact is made to the set of conductive traces, the contact bumps having a raised portion extending away from the second side of the membrane, and a contact surface on the raised portion, the contact bumps comprising a metal and particles co-deposited with the metal at or near the contact surface which comprise a material harder than the metal.

21. The contact probe of claim 20, wherein the metal comprises nickel and the particles comprise an interstitial compound.

22. The contact probe of claim 20, wherein the metal comprises nickel, the particles comprise silicon carbide having an average particle diameter of one micron or less.

23. The contact probe of claim 20, wherein the contact bumps have a diameter and the particles have an average particle diameter less than 1/10 the diameter of the contact bumps.

24. The contact probe of claim 20, wherein the contact bumps have a diameter and the particles have an average particle diameter less than 1/20 the diameter of the contact bumps.

25. A method for manufacturing a contact probe, comprising:
   providing a membrane having a first side and a second side, a set of conductive traces on the first side of the membrane, and an array of vias in the membrane extending from the first side to the second side;
   forming contact bumps in the vias, by which electrical contact is made to the set of conductive traces, the contact bumps having a raised portion extending away from the second side and a contact surface on the raised portion, the contact bumps comprising conductive material, and including particles in the conductive material at or near the contact surface, the particles comprising a material harder than the conductive material.

26. The method of claim 25, wherein the step of forming includes:
   electroplating the conductive material in a mixture including the particles under conditions which cause co-deposition of the particles and the conductive material at or near the contact surface.

27. The method of claim 26, wherein the conductive material comprises nickel and the particles comprise silicon carbide.

28. The method of claim 25, wherein the conductive material comprises a metal.

29. The method of claim 25, wherein the conductive material comprises nickel.

30. The method of claim 25, wherein the particles comprise an interstitial compound.

31. The method of claim 25, wherein the particles comprise a carbide
   of periodic table Group IV metals Ti, Zr, Hf
   or of Group V metals V, Nb, Ta
   or of Group VI metals Cr, Mo, W
   or of two or more transition metals
   or of the non-metallic elements B, Si.

32. The method of claim 25, wherein the particles comprise a nitride
   of periodic table Group IV metals Ti, Zr, Hf
   or of Group V metals V, Nb, Ta
   or of Group VI metals Cr, W
   or of two or more transition metals
   or of the non-metallic elements B, Si
   or as a metal carbonitride.

33. The method of claim 25, wherein the particles comprise a boride
   of periodic table Group IV metals Ti, Zr, Hf
   or of Group V metals V, Nb, Ta
   or of Group VI metals Cr, Mo, W
   or of two or more transitions metals
   or of the non-metallic elements C, N
   or as a metal borocarbide or metal boronitride.

34. The method of claim 25, wherein the particles comprise a silicide
   of periodic table Group IV metals Ti, Zr, Hf
   or of Group V metals V, Nb, Ta
   or of Group VI metals Cr, Mo, W
   or of two or more transition metals
   or of the non-metallic elements C, N
   or as a metal nitride-silicide or metal borosilicide or metal carbosilicide.

35. The method of claim 25, wherein the particles comprise silicon carbide.

36. The method of claim 25, wherein the particles comprise one or more of titanium nitride, zirconium nitride, boron carbide, tungsten carbide, chromium carbide and diamond.

37. The method of claim 25, wherein the particles comprise conductive material.

38. The method of claim 25, wherein the contact bump includes a layer of non-oxidizing metal on the contact surface.

39. The method of claim 25, wherein the contact bump includes a layer of noble, non-oxidizing metal on the contact surface.

40. The method of claim 25, wherein the contact bump includes a layer of rhodium on the contact surface.

41. The method of claim 25, wherein the contact bump includes a layer of ruthenium on the contact surface.

42. The method of claim 25, wherein the contact bumps have a diameter and the particles have an average particle diameter less than 1/10 the diameter of the contact bumps.

43. The method of claim 25, wherein the contact bumps have a diameter and the particles have an average particle diameter less than 1/20 the diameter of the contact bumps.

44. A method for manufacturing a contact probe, comprising:
   providing a substrate having an array of contact points;
   exposing the contact points to a mixture including an electroplating solution formulated for growing a contact bump of conductive material and particles which are harder than the conductive material on the contact points;
   supplying current to the mixture to induce growth of the contact bumps with co-deposition of metal and particles in the contact bumps.

45. The method of claim 44, wherein the step of supplying current includes:
   first supplying current at a first particular current density for an first time interval;
   second supplying current at a second particular current density for a second time interval, where the second particular current density is greater than the first particular current density to induce a greater concentration of co-deposited particles during the second time interval.

46. The method of claim 44, including:
   after the step of supplying, exposing the contact bumps to an electroplating solution formulated for growing a layer of non-oxidizing metal, and supplying current to induce growth of the layer over the conductive material of the contact bump.

47. The method of claim 44, wherein a conductive material of the contact bump comprises metal and the particles comprise an interstitial compound.

48. The method of claim 44, wherein the conductive material of the contact bump comprises nickel and the particles comprise an interstitial compound.

49. A method of claim 48, wherein the particles comprise silicon carbide having an average particle diameter of about 1 micron or less.

50. The method of claim 46, wherein the non-oxidizing metal comprises a metal selected from the group of ruthenium and rhodium.

51. The method of claim 44, wherein the contact bumps have a diameter and the particles have an average particle diameter less than 1/10 the diameter of the contact bumps.

52. The method of claim 44, wherein the contact bumps have a diameter and the particles have an average particle diameter less than 1/20 the diameter of the contact bumps.

53. A contact probe, comprising:
a probe substrate comprising a flexible material;
a set of conductive traces on the substrate;
an array of contact bumps on the substrate, by which electrical contact is made to the set of conductive traces, the contact bumps having a raised portion extending away from the substrate and a contact surface on the raised portion adapted for establishing contact to contacts on a device, the contact bumps comprising conductive material, and particles at or near the contact surface, the particles comprising a material harder than the conductive material, and further including a layer of metal on the contact surface.

54. The contact probe of claim 53, wherein the layer of metal comprises at least one of rhodium and ruthenium.

* * * * *